United States Patent [19]
Teng et al.

[11] Patent Number: 4,686,552
[45] Date of Patent: Aug. 11, 1987

[54] INTEGRATED CIRCUIT TRENCH CELL

[75] Inventors: Ker-Wen Teng; Bich-Yen Nguyen; Louis C. Parrillo, all of Austin, Tex.

[73] Assignee: Motorola, Inc., Schaumburg, Ill.

[21] Appl. No.: 864,921

[22] Filed: May 20, 1986

[51] Int. Cl.[4] .................. H01L 29/78; H01L 29/06
[52] U.S. Cl. .................................. 357/23.6; 357/51; 357/55
[58] Field of Search ........................ 357/23.6, 55, 51

[56] References Cited

U.S. PATENT DOCUMENTS

| | | | |
|---|---|---|---|
| 4,462,040 | 7/1984 | Ito et al. | 357/23.6 |
| 4,467,450 | 8/1984 | Kuo | 357/23.6 |
| 4,577,395 | 3/1986 | Shibata | 357/23.6 |

FOREIGN PATENT DOCUMENTS

| | | | |
|---|---|---|---|
| 583269 | 6/1981 | Japan | 357/23.6 |
| 5919366 | 7/1982 | Japan | 357/23.6 |

Primary Examiner—Andrew J. James
Assistant Examiner—Jerome Jackson
Attorney, Agent, or Firm—John A. Fisher; Jeffrey Van Myers; David L. Mossman

[57] ABSTRACT

A two-device trench cell having a transistor surrounded by a capacitor. This combined capacitor and transistor cell can be used as a memory cell. The capacitor is first fabricated into the walls of a trench leaving a narrowed trench into which a vertical metal-oxide-semiconductor field-effect-transistor (MOSFET) may be fabricated. One of the plates of the capacitor doubles as a source-/drain layer of the transistor.

13 Claims, 10 Drawing Figures

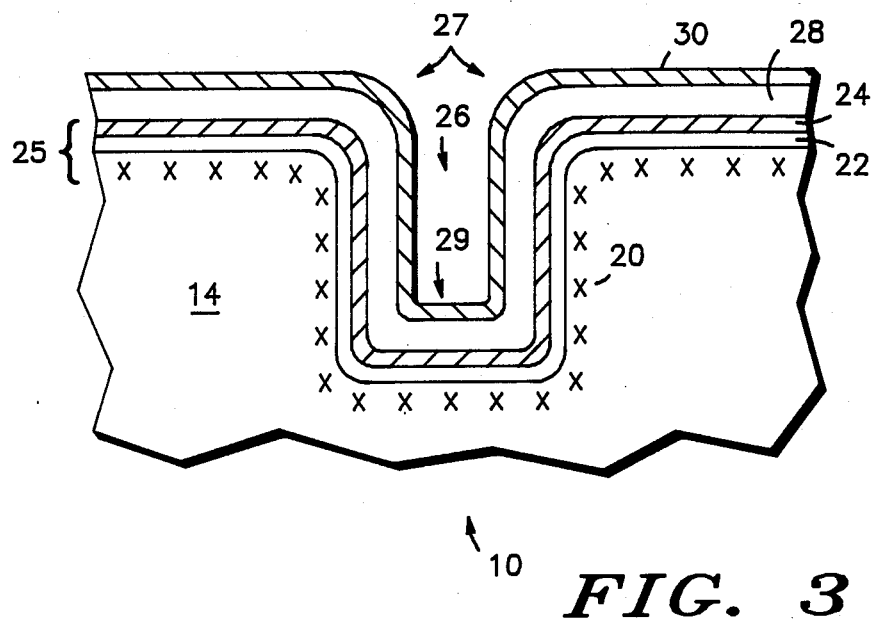
FIG. 3
FIG. 4
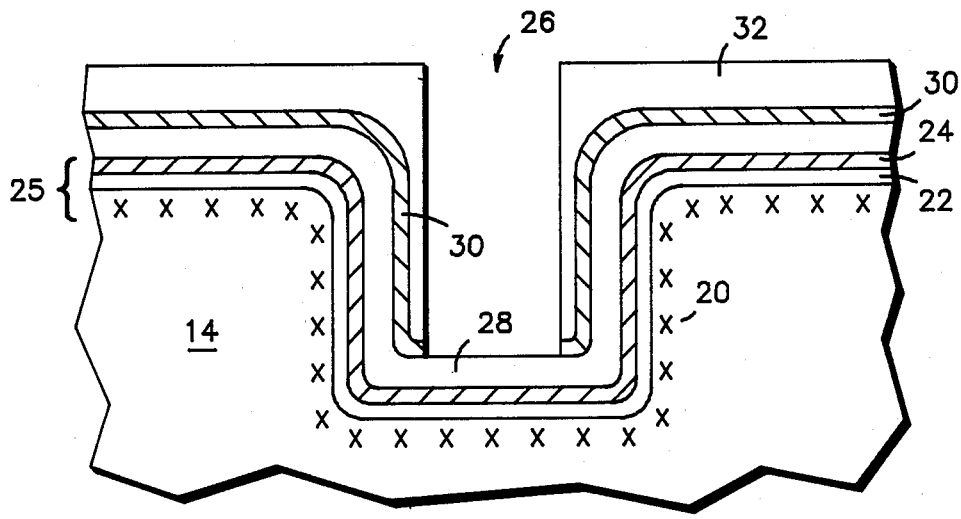

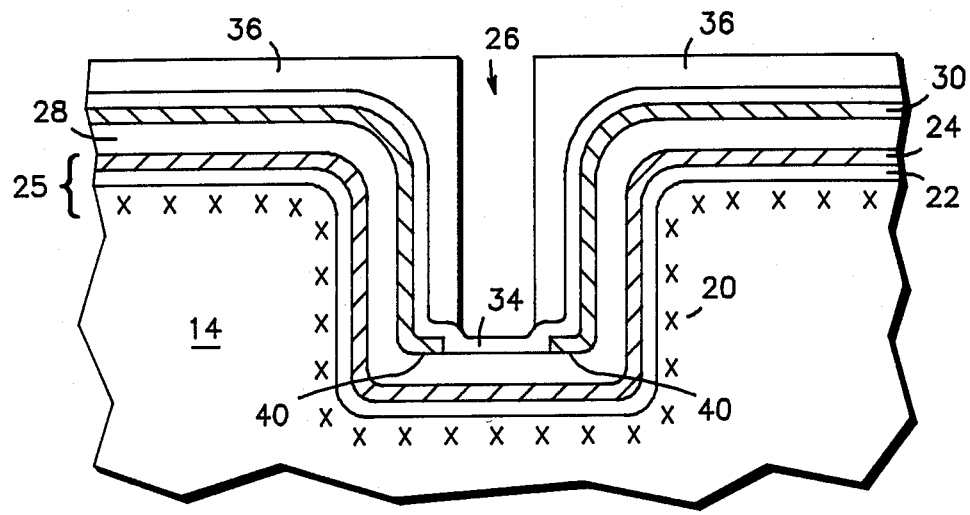
FIG. 5
FIG. 6
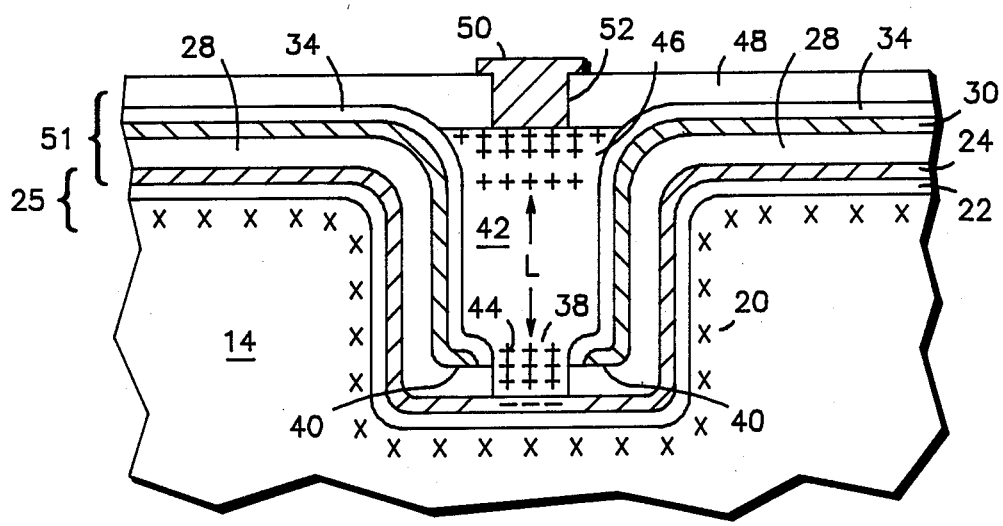

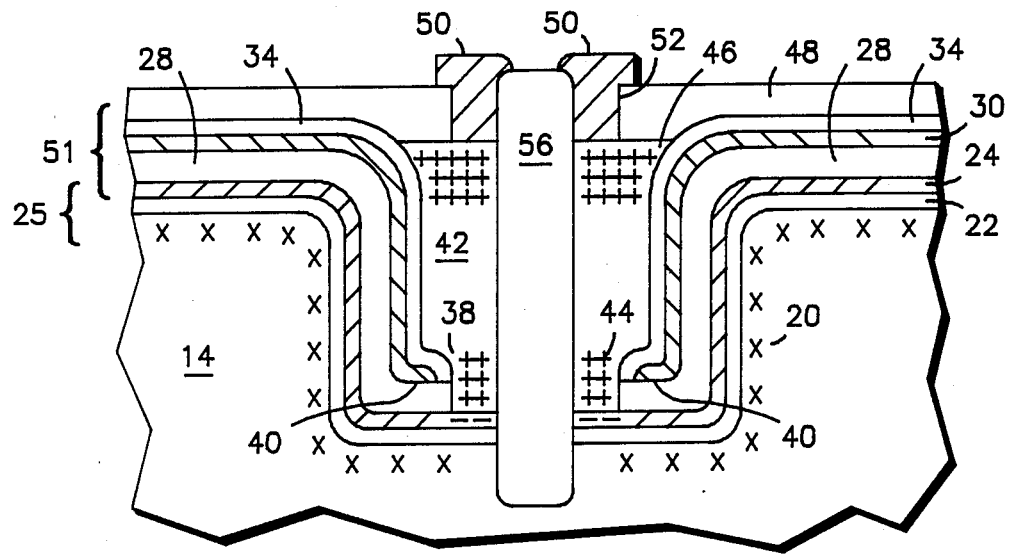
FIG. 9
FIG. 10
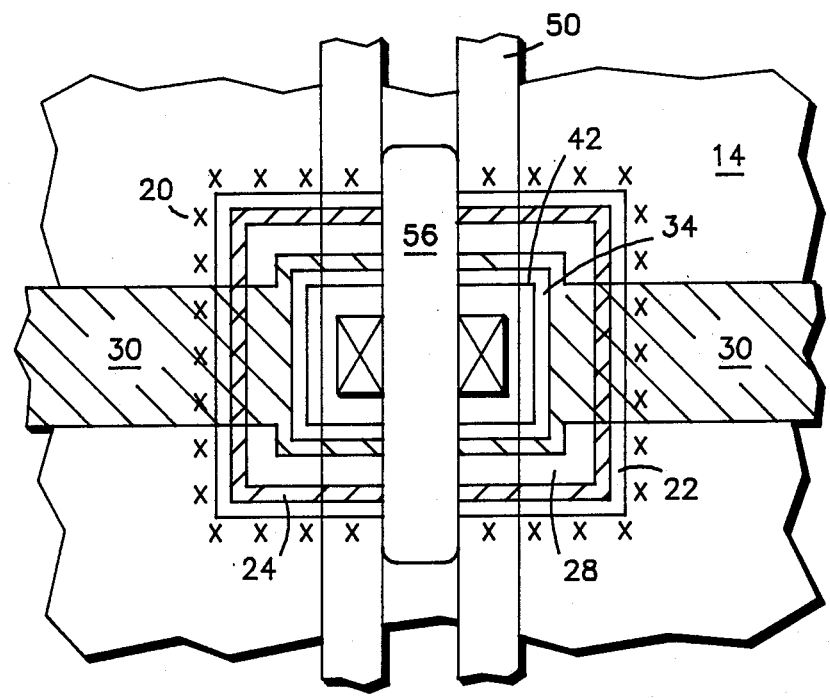

INTEGRATED CIRCUIT TRENCH CELL

FIELD OF THE INVENTION

The invention relates to integrated circuits formed in trench structures and particularly relates to trench integrated circuits where a transistor is formed in the trench.

BACKGROUND OF THE INVENTION

As the integrated circuit industry has explored ways of packing more circuits onto a given semiconductor substrate, more and more thought has been devoted to not only orienting the various devices in a planar fashion along the surface of the substrate, but also to orienting the devices vertically either by building the devices up from the substrate surface or by burying the devices in trenches formed within the face of the semiconductor body.

For example, a number of schemes for isolating customary planar devices with trench isolation regions are seen in U.S. Pat. No. 4,549,927 to Goth, and the articles "A Bipolar Process That's Repelling CMOS," *Electronics,* Dec. 23, 1986, pp. 45-47 and "Slot Isolation Yields Densest Bipolar PROM Yet," *Electronic,* Feb. 10, 1986, pp. 35-37. Trench capacitors are being employed on a commercial basis on the largest memory chips, as described by T. Costlow in "Trench Capacitors Trim Die Size of 1-Mbit DRAM," *Electronic Design,* Feb. 6, 1986, p. 34. Trench-like transistors are seen in U.S. Pat. No. 4,546,535 to Shepard, and U.S. Pat. Nos. 4,571,512 and 4,571,513, both to Schutten, et al. Another trench type transistor of vertical configuration is seen in U.S. Pat. No. 4,566,172 to Bencuya, et al.

From the above brief history, it is noted that more and more complex devices are being designed for trench manufacture. The next challenge for trench technology naturally involves placing more than one device in the same trench, such as a transistor and a capacitor to form a dynamic random access memory (DRAM) memory cell. Such an approach has been reported by B. C. Cole in "IEDM: How They're Going to Build the 4-Mb DRAM," *Electronics,* Dec. 2, 1985, where a proposal was described for placing a trench transistor on top of a trench capacitor together in a very deep, shallow trench. One odd feature of the cell is that the trench transistor is hollow, which essentially wastes the central portion of the trench. See also "DRAMs Advance to 4-Mb Level," *Electronics,* Feb. 17, 1986, pp. 26-27.

Nevertheless, as trench technology is still developing, a need exists for additional trench structures, particularly of the newer, multiple device type, so that the best alternatives may be made available and considered in the fabrication of extremely high density integrated circuits.

SUMMARY OF THE INVENTION

Accordingly, it is an object of the present invention to provide a memory cell for a DRAM employing one transistor and one capacitor.

Another object of the invention is to provide a combined capacitor/transistor cell having one transistor and one capacitor which has both devices fabricated into one trench to minimize the area of the cell.

It is another object of the present invention to provide a combined capacitor and transistor cell having one transistor and one capacitor having no wasted volume.

Still another object of the present invention is to provide a combined capacitor and transistor cell requiring no extra isolation space.

In carrying out these and other objects of the invention, there is provided, in one form, an integrated circuit formed in a substrate having a trench with walls and a top portion and a bottom portion, a trench capacitor formed on the walls of the trench, leaving a narrowed trench within the trench, and a transistor formed in the narrowed trench within the capacitor and isolated therefrom.

BRIEF DESCRIPTION OF THE DRAWINGS

FIG. 3 is a cross-section illustration of the trench capacitor of FIG. 2 during early fabrication of the trench transistor within the narrowed trench space left by the trench capacitor;

FIGS. 4 and 5 are cross-section illustrations of the trench transistor portion of the cell of this invention in various stages of construction;

FIG. 6 is a cross-section illustration of the completed cell of the present invention;

FIG. 9 is a cross-section illustration of another embodiment of the cell of this invention essentially showing the cell of FIG. 6 bisected by an isolation region; and FIG. 10 is a cross-section illustration of the embodiment of the bisected cell of FIG. 9 as seen from above in plan view.

DETAILED DESCRIPTION OF THE INVENTION

Figure 1:
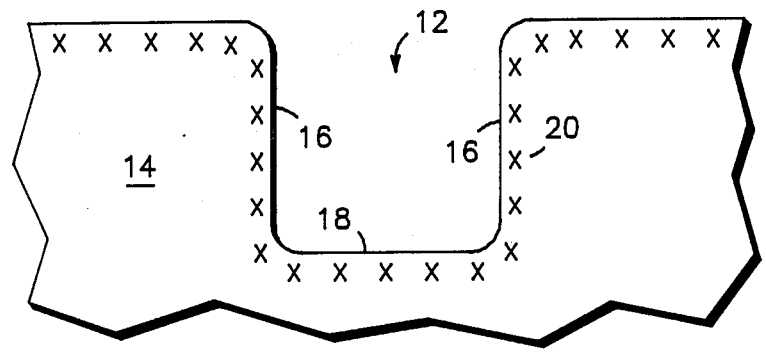
FIG. 1 is a cross-section illustration of a newly formed trench early in the stages of fabrication of a trench cell of this invention.
Figure 7:
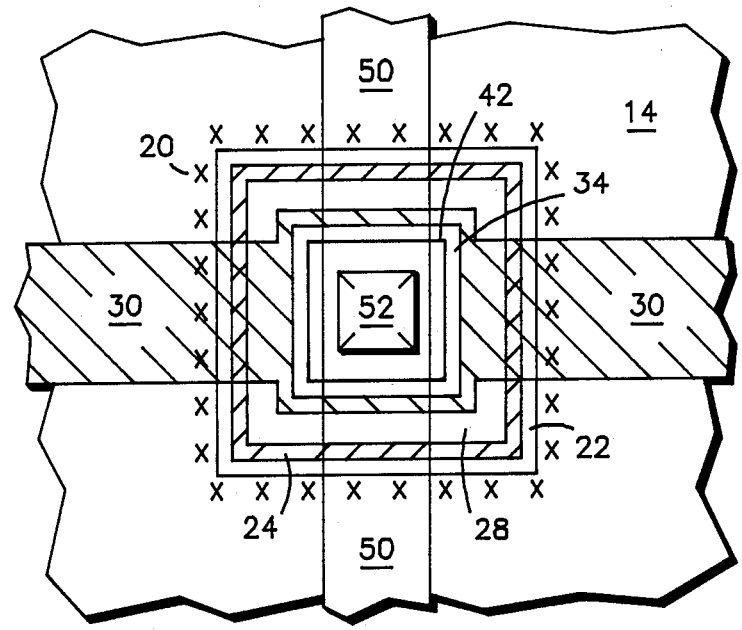
FIG. 7 is a cross-section illustration of the completed cell of FIG. 6 as seen from above in plan view.

Shown in FIG. 1 is a memory cell 10 under construction illustrating a trench 12 in semiconductor bulk substrate 14 where the trench has vertical sides 16 and a bottom or floor surface 18, wherein at least vertical sides 16 and bottom surface 18 have been doped to be conductive and function as one plate 20 of the capacitor 25 portion of the memory cell 10. The trench 12 does not have to be an extraordinarily deep, narrow one. On the contrary, it may have almost cubic dimensions such as 3 microns (um)×3 um×3 um, for example. The trench in the present illustration is taken to have a square shape when viewed from above, for example, as seen in FIG. 7. However, this trench shape is also not considered to be crucial to the invention. If trench 12 had a circular cross-section viewed from above, the memory cell 10 would function just as well as with the square profile, however, there would be only one cylindrical trench vertical side wall 16 of a cylindrical shape rather than four separate rectangular walls.

The substrate 14 may be any of the common semiconductor substrates. In this case, the substrate 14 will be considered to be silicon. Substrate 14 may also be a thin epitaxial layer, if desired. The capacitor plate doping layer 20 may be of either conductivity type, but in this particular illustration, which does not limit the invention, the doping as represented by the Xs is taken to be of n+ or donor-type.

Figure 2:
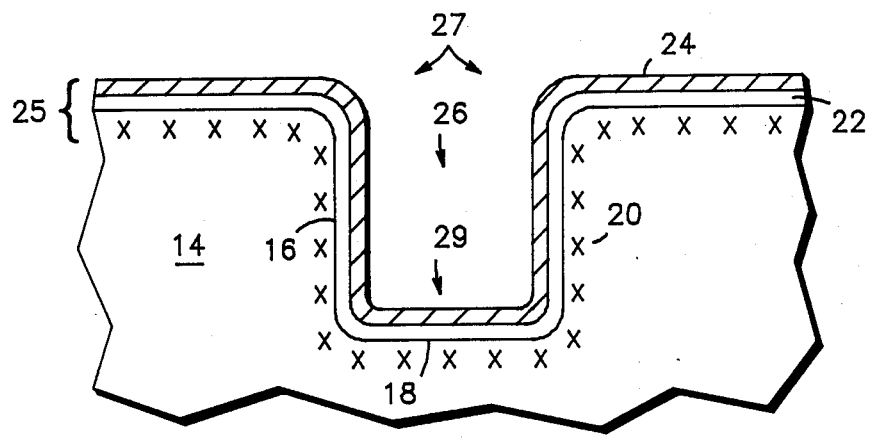
FIG. 2 is a cross-section illustration of the trench of FIG. 1 after the elements of the capacitor of the present cell of this invention are fabricated.

Next, as shown in FIG. 2, a capacitor dielectric layer 22 is formed over at least vertical trench sides 16 and trench bottom surface 18 over which a first layer of conductive material 24 is fabricated to form the other plate of the trench capacitor 25. This layer 24 may be thought of as a "floating" plate of capacitor 25. Capacitor dielectric layer 22 may be any of the common dielectric materials formed by any of the common techniques, such as chemical vapor deposition, etc. For example only, capacitor dielectric layer 22 may be silicon dioxide, $SiO_2$, silicon nitride, $Si_3N_4$, a combination of the two in thin layers such as oxide/nitride/oxide (ONO), or any other suitable dielectric. For the illustrative purposes of the invention, capacitor dielectric layer 22 will be taken to be an ONO layer.

First conductive material layer 24 may be any suitable conductive material such as doped silicon, doped polysilicon, aluminum, a refractory metal, a refractory metal silicide, a double thin layer of a refractory metal silicide and doped polysilicon (polycide), etc. In the illustration herein only, first conductive material layer 24 will be taken to be n+-doped polysilicon formed via low pressure chemical vapor deposition (LPCVD) in an in situ deposition. The first conductive material layer 24 not only acts as the substrate of the trench capacitor 25, but also as the source/drain region of the vertical metal-oxide-semiconductor field effect transistor 51 (MOSFET) component of the cell 10. When the capacitor 25 and the MOSFET 51 are connected together through first conductive material layer 24 to form a memory cell, layer 24 will be serving as the source of the MOSFET 51. As seen in FIG. 2, the capacitor 25 of the cell 10 is essentially complete. Since the capacitor 25 conforms closely to the vertical sides 16 and bottom surface 18 of trench 12, considerable empty space remains in which the remainder of the MOSFET 51 may be formed, which empty space is designated as narrowed trench 26. Narrowed trench 26 has a top 27 and a bottom 29. The MOSFET 51 will have one source/drain region near the bottom 29 and the other drain/source region near the top 27 of the trench, and the carrier channel will be oriented vertically between them.

Next, as shown in FIG. 3, a first transistor dielectric layer 28 is formed over first conductive material layer 24. First transistor dielectric layer 28 may be of any of the materials described above with reference to capacitor dielectric layer 22. For the illustrative purposes of the present invention only, first transistor dielectric layer 28 will be considered to be a deposited layer of thick low temperature oxide (LTO), for example, approximately 1000 to 6000 angstroms thick, or borophosphosilicate glass (BPSG). Layer 28 will act as the insulating dielectric between n+ polysilicon layer 24 and the next or gate conductive layer 30, which may be any of the suitable conductive materials discussed above in connection with first conductive material layer 24. For the illustrative purposes of the invention only, gate conductive layer 30 will be taken as n+-doped polysilicon. Layer 30 will act as the gate electrode of the vertical MOSFET 51.

Next, as shown in FIG. 4, a first mask 32 is patterned over the cell 10 under construction, which first mask 32 reaches down into the narrowed trench 26 to gate conductive layer 30. Mask 32 may be any of the generally accepted mask materials such as photoresist which should be patterned in the customary way by deposition, exposure and removal of unwanted material to reopen narrowed trench 26. An anisotropic etch should then be conducted through narrowed trench 26 to etch gate conductive layer 30 and stop on first transistor dielectric layer 28.

Shown in FIG. 5 is the cell 10 under construction from FIG. 4, after a second transistor dielectric layer 34 has been blanketed over the remainder of gate conductive layer 30 after a hole was etched in layer 30 in FIG. 4. Second transistor dielectric layer 34 may again be any of the suitable dielectrics mentioned earlier. For the purposes of illustrating the invention only, second transistor dielectric layer 34 will be considered to be another ONO layer. This layer 34 should be relatively thin for it forms the gate dielectric of the vertical MOSFET 51. Again, a second mask 36 is formed over the cell 10 under construction, and another anisotropic etch is performed through second transistor dielectric layer 34 and first transistor dielectric layer 28 stopping on first conductive material 24. This second anisotropic etch opens up a carrier channel hole 38 by which the source/drain region 44 may be contacted by the first conductive material layer 24.

It is noted that at the stage depicted in FIG. 5, that a gate material lip 40 extends into the narrowed trench space 26 a short distance. Lip 40 is not an essential element of the invention, but rather is an expected side effect from the first etch process give the current stage of patterning and etch technology. Gate conductive layer 30 may instead be patterned completely vertically with no lip 40 using future technology of patterning and etch. At present, there is no known technique that permits etch back of the layers in the trench right up to the wall or vertical sides, thus some small portion of lip 40 will necessarily form.

Shown in FIG. 6 is the finished cell 10 which is essentially a cylindrical vertical MOSFET 51 surrounded by and connected to a trench capacitor 25. The narrowed trench 26 is filled by semiconductor plug 42, which if doped at all should be lightly doped only. In the illustrative device of this description, plug 42 would be p− doped. It may be advantageous to provide plug 42 in more than one step to ensure complete filling of the narrowed trench 26 to prevent leaving undesirable voids, a recognized problem in filling trenches. First source/drain conductive layer 44 at the bottom of semiconductor plug 42 may be formed by one of at least three ways. One technique is to make sure that first conductive material layer 24 is somewhat heavily doped. In the illustration being used herein, layer 24 would be n+ doped. After plug 42 is in place at some subsequent step, the dopant present in layer 24 is out-diffused into plug 42 to form first source/drain conductive layer 44 via an anneal step or thermal drive-in cycle. In the alternate technique, with second patterned mask 36 still in place, the exposed portion of first conductive material layer 24 is implanted with appropriate dopant atoms, which are subsequently out-diffused in a subsequent anneal step into plug 42 to form first source/drain conductive layer 44. Or the narrowed trench 26 may be partly filled with p− material with the second patterned mask 36 still in place, after which the p− semiconductor material may be directly implanted with n+ impurities to form first source/drain conductive layer 44. The pattern 36 is then stripped and the remainder of narrowed trench 26 is subsequently filled with semiconductor material 44.

After plug 42 is formed, filling the remainder of narrowed trench 26, the top end of the plug 42 may be doped to form second drain/source conductive layer 46 by implantation, diffusion or other means. Second drain/source conductive layer 46 is n+ doped in the illustrative cell 10 in the present description. The distance L is the channel length, the entire length of which may be activated by gate conductive layer 30 on the other side of second transistor dielectric layer 34. The channel length, L, is dependent upon three parameters, the length of the semiconductor plug 42, the thickness of first source/drain conductive layer 44 and the thickness of second drain/source conductive layer 46.

To complete the desired structure of cell 10, the MOSFET 51 portion of cell 10 is covered by a passivation layer 48 which may be a glass or other suitable material. Electrical connection 50 may be cut into passivation layer 48 by etching and filling a contact or via hole 52 by any of the techniques well known in the art.

Shown in FIG. 7 is a plan or top view of the memory cell 10 of the present invention as it might appear in a memory array, demonstrating its concentric nature. In this embodiment, electrical connection 50 becomes the bit line of the memory array, while gate conductive layer 30 becomes the buried word line and first conductive material layer 24, the doped trench walls, capacitor plate 20 becomes a connection to ground or ½ $V_{cc}$.

The critical observer looking at the concentric barrel design of the memory cell 10, comprising a MOSFET 51 wrapped and enclosed by a trench capacitor 25, will realize that if the cell 10 were bisected or otherwise divided by one or more intersecting isolation regions 56 in the manner of dividing a pie as viewed from above as in FIG. 10, that multiple capacitor/MOSFET pairs could result from the present invention structure. FIG. 9 shows a profile cross-section of the cell 10 of FIG. 6 divided by an isolation region 56. One skilled in the art would need access to a technology that could open and fill still narrower trenches than the ones contemplated for the described embodiment of the present invention to achieve such a bisected cell. In essence, the number of devices could be increased by two or more with little increase in surface area utilization for additional isolation 56. In the case of multiple cells made from the concentric structure of FIG. 7 by dividing it with one or more isolation regions, one skilled in the art could connect the various components of the cells in any manner desired. Because the components would already be closely associated, interconnections may be made unusually short.

Alternatively, because of its box-like, cylindrical or barrel-shaped nature, the cell 10 in FIG. 7 may be viewed as having elements with large enough areas to provide redundancy should a portion of one of the layers fail.

Figure 8:
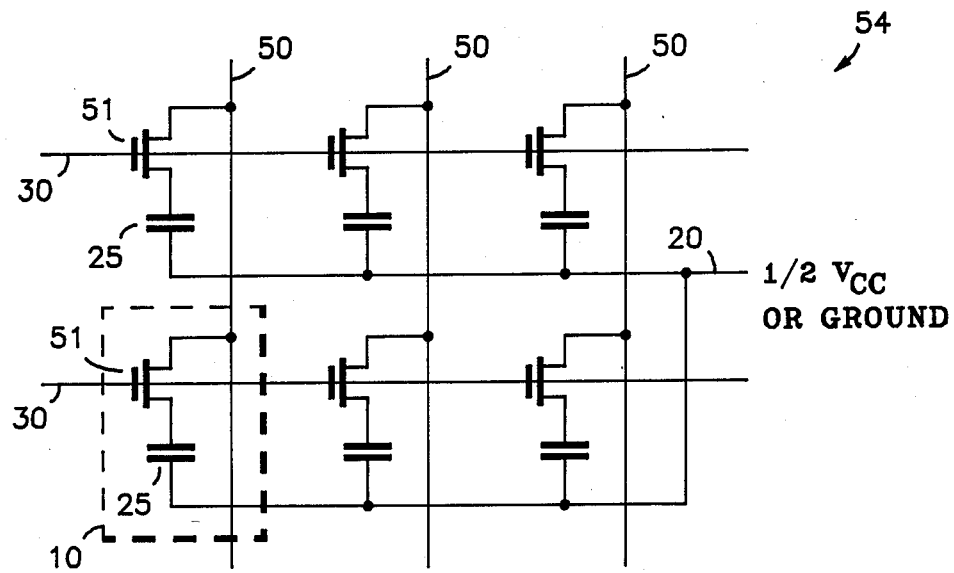
FIG. 8 is a schematic illustration of how the combined capacitor and transistor cells of the present invention may be oriented in a memory array.

Shown in FIG. 8 is a portion of a memory array 54 in which the memory cell 10 of the present invention might appear. The bit lines 50 run vertically and the word lines 30 run horizontally as in FIG. 7. The connection of the substrate plate of the capacitor 25 to ½ $V_{cc}$ or ground is capacitor plate 20. The one-transistor memory cell array 54 of FIG. 8 is not unique to this invention and is well known in the art. However, the memory cell array 54 is one use for the memory cell 10 of the present invention. No doubt the cell 10 can and will have many other implementations and uses in integrated circuitry.

The cell 10 of the present invention offers a number of advantages over previous known devices. For example, a memory cell with a very small area can be achieved, aided by a buried word line, which may be for example a CVD refractory gate layer. Soft error rates in DRAMS, caused by cosmic rays, can be minimized and no extra isolation space is required with this structure, since isolation is accomplished by dielectrics and not junctions, thereby minimizing charge leakage paths. In addition, no buried contacts are needed.

We claim:

1. An integrated circuit formed in a substrate, comprising a trench having walls and a top portion and a bottom portion, a trench capacitor comprising two plates, the capacitor formed on the walls of the trench leaving a narrowed trench within the trench after the formation of both plates, and a transistor formed within the narrowed trench within the capacitor and isolated therefrom.

2. The integrated circuit of claim 1 wherein the transistor has a vertical carrier path between the top and bottom of the trench.

3. The integrated circuit of claim 2 wherein the transistor further comprises a gate, and the capacitor and the gate of the transistor surround the vertical carrier path of the transistor.

4. The integrated circuit of claim 1 wherein the capacitor has a plate and the transistor has a source/drain region and wherein the plate and the source/drain region are identical.

5. A trench integrated circuit cell formed in a face of a semiconductor substrate comprising:
   a trench having at least one vertical wall and a bottom surface within the face of the semiconductor substrate;
   a capacitor comprising two plates, the capacitor formed on the wall of the trench leaving a narrowed vertical trench after the formation of both plates having a top and a bottom; and
   a transistor within the narrowed vertical trench comprising two source/drain regions, a vertical channel and a gate, the source/drain regions being formed by heavily doped regions oriented one over the other in the narrowed trench having the channel between them, wherein the gate surrounds the vertical channel and is separated therefrom by a thin dielectric layer, and one of the source/drain regions is electrically connected to the capacitor.

6. The integrated circuit cell of claim 5 wherein the capacitor and the transistor that are electrically connected together have a common region serving simultaneously as the plate of the capacitor and as one of the transistor's source/drain regions.

7. The integrated circuit cell of claim 5 wherein the cell is divided into two or more cells by at least one or more intersecting isolation regions.

8. A trench integrated circuit cell formed within a semiconductor substrate comprising:
   a trench within a face of the semiconductor substrate, the trench comprising at least one vertical wall and one horizontal bottom surface;
   a capacitor within the trench in the surface of the semiconductor substrate comprising two plates and a dielectric between them, where the plates and the dielectric are formed along the wall of the trench; and a transistor within the capacitor in the surface of the semiconductor comprising:
  a first source/drain conductive layer at the bottom of the trench, which layer is coincident with one of the capacitor plates;
  a second drain/source conductive layer within the trench above the first source/drain conductive layer;
  a region of semiconductor material within the trench to form a vertical channel between the first source/drain conductive layer and the second drain/source conductive layer; and
  a gate electrode surrounding the vertical channel region of semiconductor material and separated from the vertical channel region of semiconductor material by a thin layer of dielectric material.

9. The integrated circuit cell of claim 8 wherein the cell is divided into two or more cells by at least one or more intersecting isolation regions.

10. An integrated circuit cell formed within a semiconductor substrate comprising:
  a trench within a face of the semiconductor substrate, the trench comprising at least one vertical wall and one horizontal bottom surface;
  a capacitor within the trench in the surface of the semiconductor substrate comprising:
    a doped trench wall forming one plate of the capacitor;
    a capacitor dielectric layer covering the doped trench wall surface;
    a first conductive layer comprising a semiconductor material covering the capacitor dielectric layer forming another plate of the capacitor; and
    a narrowed trench within the the first conductive layer of the capacitor; and
  a transistor within the narrowed trench in the face of the semiconductor comprising:
    a first source/drain conductive layer identical with the first conductive layer of the capacitor;
    a first transistor dielectric layer covering the first source/drain conductive layer;
    a transistor gate layer covering the first transistor dielectric layer;
    a second transistor dielectric layer covering the transistor gate layer;
    a second drain/source conductive layer in the form of a central plug in the trench above the first source/drain conductive layer;
    a carrier channel pathway through portions of the first transistor dielectric layer, transistor gate layer and second transistor dielectric layer, connecting the second drain/source conductive layer with the first source/drain conductive layer, such that second drain/source conductive layer is insulated from the transistor gate layer by the second transistor dielectric layer; and
    first and second regions of doping at the bottom and top of the second drain/source conductive layer, respectively.

11. The integrated circuit cell of claim 10 wherein the cell is divided into two or more cells by at least one or more intersecting isolation regions.

12. An integrated circuit cell formed within a semiconductor substrate comprising:
  a trench within a face of the semiconductor substrate, the trench having at least one vertical wall and one horizontal bottom surface;
  a capacitor within the trench in the surface of the semiconductor substrate comprising:
    a trench wall forming one plate of the capacitor, doped with an impurity of a first conductivity type;
    a capacitor dielectric layer covering the doped trench wall; and
    a first conductive layer comprising a semiconductor material, doped with an impurity of the first conductivity type, covering the capacitor dielectric layer forming another plate of the capacitor; and
  a transistor within the trench in the face of the semiconductor comprising:
    a first source/drain conductive layer identical with the first conductive layer of the capacitor;
    a first transistor dielectric layer covering the first source/drain conductive layer;
    a transistor gate layer covering the first transistor dielectric layer, the transistor gate layer comprising a semiconductor material of the first conductivity type;
    a second transistor dielectric layer covering the transistor gate layer;
    a second drain/source conductive layer in the form of a central plug within the trench that remains above the first source/drain conductive layer, the second drain/source conductive layer comprising a semiconductor material of a second conductivity type, and having a bottom and top;
    a carrier channel pathway through portions of the first transistor dielectric layer, transistor gate layer and second transistor dielectric layer, connecting the second drain/source conductive layer with the first source/drain conductive layer, such that second drain/source conductive layer is insulated from the transistor gate layer by the second transistor dielectric layer; and
    first and second regions of doping of the first conductivity type at the bottom and top, respectively, of the second drain/source conductive layer.

13. The integrated circuit cell of claim 12 wherein the cell is divided into two or more cells by at least one or more intersecting isolation regions.

* * * * *